(12) United States Patent
Rampley et al.

(10) Patent No.: US 8,742,599 B2
(45) Date of Patent: Jun. 3, 2014

(54) IDENTIFICATION MECHANISM FOR SEMICONDUCTOR DEVICE DIE

(75) Inventors: Colby G. Rampley, Phoenix, AZ (US); Lawrence S. Klingbeil, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/599,388

(22) Filed: Aug. 30, 2012

(65) Prior Publication Data

US 2014/0061952 A1 Mar. 6, 2014

(51) Int. Cl.
*H01L 23/49* (2006.01)

(52) U.S. Cl.
USPC ........... 257/782; 438/460; 438/401; 438/122; 438/15; 438/617

(58) Field of Classification Search
USPC ............................ 438/460, 401, 122, 15, 617
See application file for complete search history.

(56) References Cited

U.S. PATENT DOCUMENTS

| 7,749,690 B2 | 7/2010 | Woolaway et al. |
| 2002/0058396 A1* | 5/2002 | Roberts et al. ................ 438/460 |
| 2005/0283266 A1* | 12/2005 | Geraci et al. .................. 700/115 |

* cited by examiner

*Primary Examiner* — Chuong A Luu
*Assistant Examiner* — Rodolfo Fortich
(74) *Attorney, Agent, or Firm* — Jonathan N. Geld

(57) ABSTRACT

A method and system for uniquely identifying each semiconductor device die from a wafer is provided. Identifying features are associated with device die bond pads. In one embodiment, one or more tab features are patterned and associated with each of one or more device die bond pads. These features can represent a code (e.g., binary or ternary) that uniquely identifies each device die on the wafer. Each tab feature can be the same shape or different shapes, depending upon the nature of coding desired. Alternatively, portions of the one or more device die bond pads can be omitted as a mechanism for providing coded information, rather than adding portions to the device die bond pads.

11 Claims, 4 Drawing Sheets

IDENTIFICATION MECHANISM FOR SEMICONDUCTOR DEVICE DIE

BACKGROUND

1. Field

This disclosure relates generally to semiconductor fabrication, and more specifically, to a mechanism for visibly identifying on each device die of a wafer.

2. Related Art

There are many well-known semiconductor processing techniques for manufacturing modern integrated circuits. A typical procedure in the manufacturing process includes photolithography, which involves passing light through a reticle, or mask, to expose a layers image for one or more die on a wafer. The wafer is moved to a new position (a process called "stepping") and the photolithographic processes are repeated until the pattern of the reticle has been replicated on each die of the wafer.

A drawback of such a conventional photolithographic process is that it is not possible to provide a unique identification for each die on the wafer. This is because the same reticle is exposed in multiple locations and results in the same pattern at each location. But the ability to uniquely identify each die from a wafer, even after the die have been separated from the wafer, can provide certain advantages such as tracking of the die during and after test, assembly, and packaging processes. It is therefore desirable to provide a mechanism by which each die from a wafer can be uniquely identified. It is further desirable that the identification mechanism have minimal impact on overall device processing steps, as well as provide no increase in radio frequency interference on the device die.

BRIEF DESCRIPTION OF THE DRAWINGS

The present invention may be better understood, and its numerous objects, features, and advantages made apparent to those skilled in the art by referencing the accompanying drawings.

FIG. 3 is a simplified block diagram illustrating a bond pad including identifying features, in accord with embodiments of the present invention.

The use of the same reference symbols in different drawings indicates identical items unless otherwise noted. The figures are not necessarily drawn to scale.

DETAILED DESCRIPTION

A method and system for uniquely identifying each semiconductor device die from a wafer is provided by embodiments of the present invention. Identifying features are associated with device die bond pads. In one embodiment, one or more tab features are patterned and associated with each of one or more device die bond pads. These features can represent a code (e.g., binary or ternary) that uniquely identifies each device die on the wafer. For example, an (X, Y) coordinate system can be represented by the code. Each tab feature can be the same shape or different shapes, depending upon the nature of coding desired. Alternatively, portions of the one or more device die bond pads can be omitted as a mechanism for providing coded information, rather than adding portions to the device die bond pads. By associating the identifying features with the bond pads, practical size limitations of the identifying features can be significantly smaller than for standalone features. Further, by locating the identifying features in the bond pad region of the semiconductor device die, any RF interference associated with the additional metallization is minimized since the features are not located over a circuit region of the semiconductor device die.

It is often desirable to be able to identify particular semiconductor device die for traceability purposes. In some applications, such as memory devices, the semiconductor device die can have an electronic encoded chip identifier capability that can be read by an external device. But there are many semiconductor device die than do not have EECID capability.

While simply printing die coordinates (e.g., (X, Y) coordinates from a wafer) on a semiconductor device die may be possible, it is not practical to make changes to front end photolithography reticles. Further, minimum design rules for standalone features in current photolithography techniques provide for 20 µm lines and spaces. So space to write a multidigit alphanumeric is large and would require writing over active circuitry, which may cause RF interference. Embodiments of the present invention avoid these drawbacks by reducing the space required to provide unique identifiers and avoiding adding metal over active circuitry.

Figure 1:
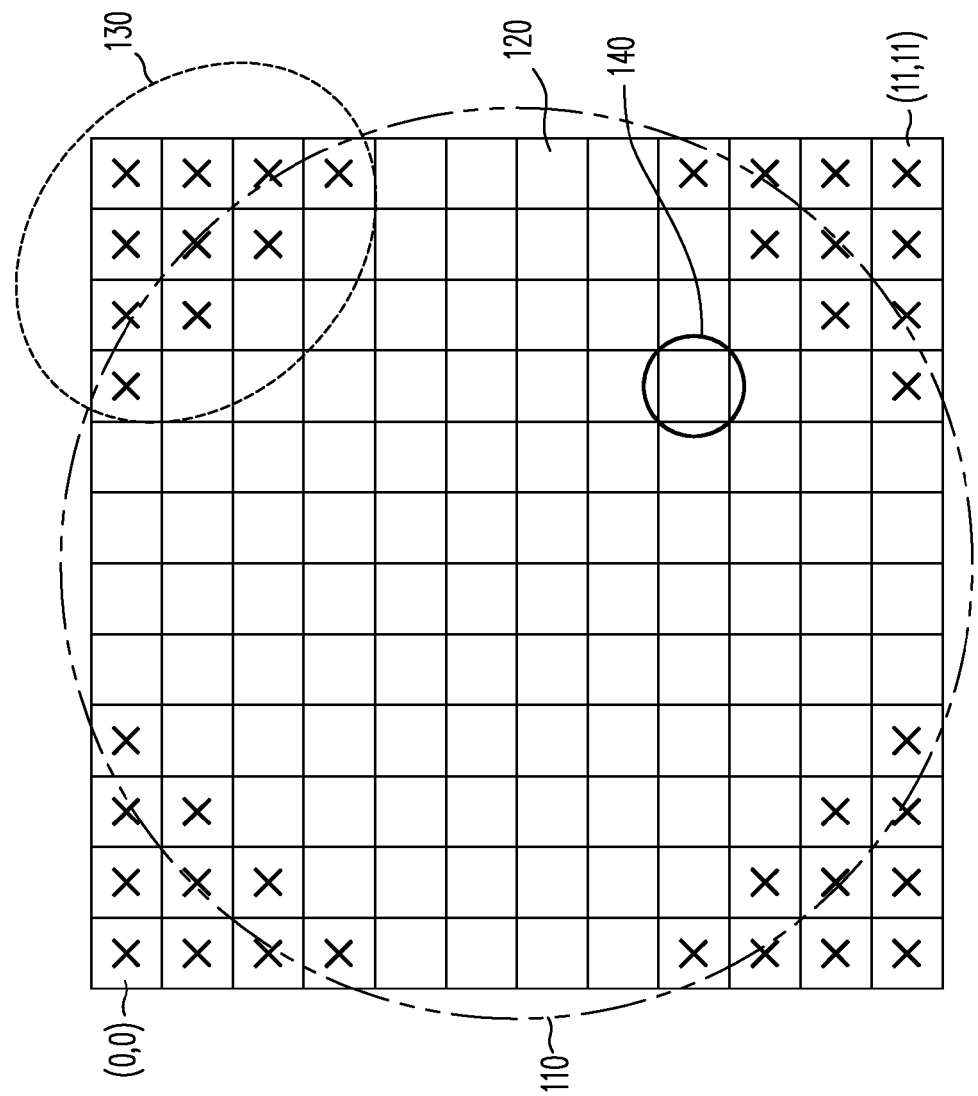
FIG. 1 is a simplified block diagram illustrating a semiconductor wafer map for individual integrated circuit dies formed thereon.

FIG. 1 is a simplified block diagram illustrating a semiconductor wafer map for individual integrated circuit dies formed thereon. Wafer perimeter 110 represents a semiconductor wafer used for semiconductor device fabrication. Grid 120 provides an (X, Y) coordinate system defining a set of squares within each of which a semiconductor device die (e.g., device die 140) is formed, if the square is located on the wafer and in a processable region of the wafer. For example, corner region 130 has associated grid coordinates, but squares associated with those coordinates are either not within wafer parameter 110 or are so close to the edge of wafer perimeter 110 that no device die will be formed in that region.

In current technology, wafer diameters of 150 mm, 200 mm, and 300 mm are common. Semiconductor wafers of these dimensions can be processed to include hundreds to thousands of possible die per wafer (PDPW), depending upon the nature of the circuitry provided by those semiconductor device die and the nature of the processing technology used in manufacturing the semiconductor devices.

During processing, spaces are provided between each formed semiconductor device die. Upon completion of the integrated circuits in the dies, a cutting tool is used to singulate the individual dies (e.g., device die 140) from the semiconductor wafer and each other die. Once singulated, without unique identification for each die, it is not generally possible to determine where on the original wafer the individual device die were formed.

Figure 2:
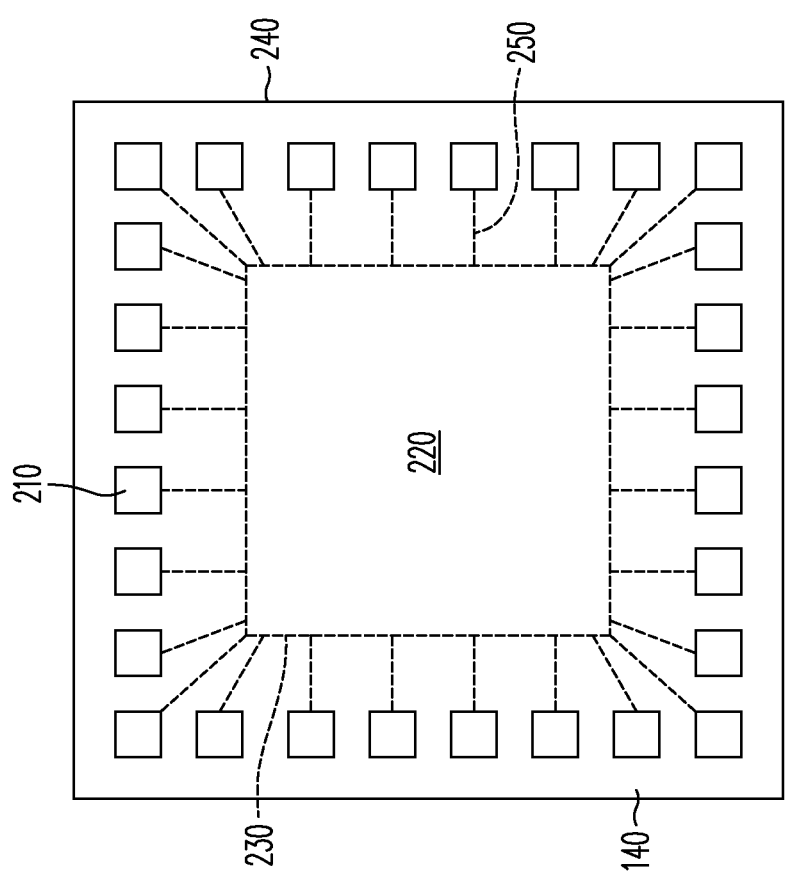
FIG. 2 is a simplified block diagram illustrating an example of a semiconductor device die.

FIG. 2 is a simplified block diagram illustrating an example of a semiconductor device die 140. Semiconductor device die 140 includes multiple bond pads 210 for interconnecting the die with other components. The number of bond pads 210 on a die can vary depending upon the number of input/outputs to and from the device die circuitry that are required. Bond pads can be formed using metallization techniques known in the art, such as sputtering and photolithography, and couple to device interconnects within the die. Bond pads can be formed from a variety of metals, for example, aluminum, gold, metal alloys and the like, depending on the nature of the application.

A typical semiconductor device die 140 also includes a circuit region 220 surrounded by a circuit perimeter 230. Circuit region 220 is the area of the semiconductor device die that includes the active devices and electrical interconnects forming the integrated circuit, with the exception of input/output leads extending to the bond pads along device die perimeter 240. Input/outputs of circuit region 220 are electrically connected to bond pads 210 using leads 250. Leads 250 are often formed in a device interconnect built up in the device die.

The bond pads are positioned in a region located between circuit perimeter 230 and device die perimeter 240. By physically separating the circuit region from the region including the bond pads in this manner, damage to devices within the circuit region can be avoided during stresses associated with performing bond between the bond pads and external components (e.g., heating and pressures associated with wire bonding). Further, RF effects caused by bond pad metallization are reduced by this physical separation. The number of bond pads on a die can vary depending upon the number of inputs/outputs the die requires. Semiconductor device die can include thousands of bond pads for each die, depending upon the nature of the circuitry provided by the die.

FIG. 3 is a simplified block diagram illustrating an example of a bond pad including identifying features, in accord with embodiments of the present invention. Bond pad 300 has a main bond pad body 310 and a set of identification features 320, 322, and 324. As will be discussed more fully below, the identification features can be used alone or in conjunction with identification features associated with other bond pads of a semiconductor device die to uniquely identify the semiconductor device die associated with the bond pads. Bond pad 300 is formed using photolithographic techniques known in the art.

Photolithographic processes presently have minimum design rules of, for example, 20 μm for standalone features. Features that are not standalone, but are instead associated with another larger feature, can have significantly smaller sizes than the standalone minimum design rule. One reason for this is that the larger associated feature prevents separation of the smaller features from the surface on which those features are formed. Thus, identification features 320, 322, and 324 can have a width 330 down to as low as on the order of 5 μm and the spaces between the identification features (e.g., space 340) can also be on the order of 5 μm, depending on the processes used to form bond pad 300. Since a typical bond pad body 310 can be on the order of 100 μm in width or height, larger identification features can be provided having sufficient room for the identification features and spaces between them in order to optically distinguish between each identification feature.

One use for forming the identification features is to enable unique identification of each semiconductor device die on a wafer. Unlike a stepper process in which one pattern is repeatedly used for each die on a wafer, the unique identification features and bond pads can be provided by using a single plate that patterns all the bond pads for the wafer at one time (e.g., a 1× plate). Thus, on this plate each die will be provided with a unique code pattern.

Figure 4:
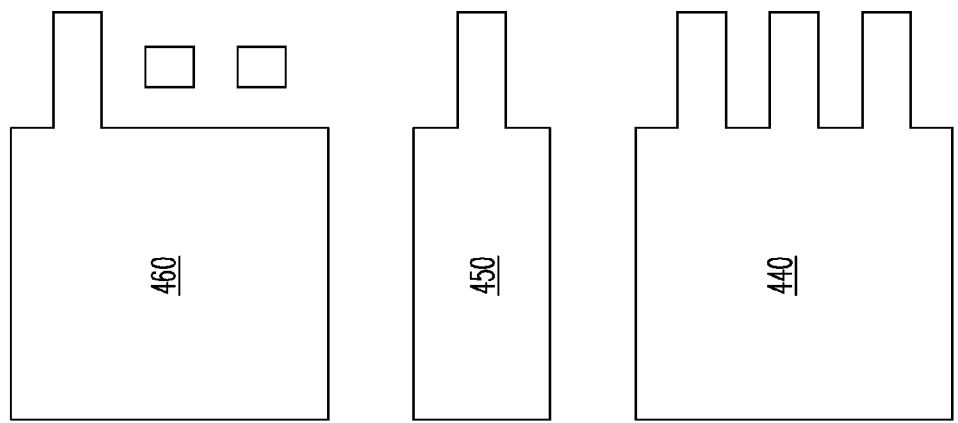
FIG. 4 is a simplified block diagram illustrating one example of a method by which a unique coding can be provided to a semiconductor device die, using embodiments of the present invention.

FIG. 4 is a simplified block diagram illustrating one example of a method by which a unique coding can be provided to a semiconductor device die, using embodiments of the present invention. Bond pads 410, 420, and 430 can provide identification features that express a code for an X-coordinate of the semiconductor device die on, for example, grid 120. Bond pads 440, 450, and 460 can provide notification features that express a code for a Y-coordinate of the semiconductor device die on, for example, grid 120. In this example, the identification features correspond to a seven-place binary code where each digit of the binary code is represented by the presence or absence of an identification feature in a predetermined space along the edge of a set of three bond pads. As illustrated, the small squares represent the absence of an identification feature. Thus, the X-coordinate represented by the identification features on bond pads 410, 420, and 430 is 77 (1+4+8+64). Similarly, the Y-coordinate represented by the identification features on bond pads 440, 450, and 460 is 79 (1+2+4+8+64). Using such a seven-place binary code, unique identification of semiconductor device die associated with a grid of 128×128 rows and columns (approximately 15000 possible die per wafer) can be provided. It should be noted that embodiments of the present invention are not limited to binary encoding, as will be illustrated below. Nor are embodiments of the invention limited to a particular direction of interpreting the tabs, ordering of bond pads associated with tabs, or even proximity of pads to one another. Additionally, the exact ordering of tabs for coding purposes can be purposefully obscured such that only customers who have been informed of the appropriate interpretation order can use the information.

Identification of each die can be performed using optical inspection if the die is separate from a package, or by x-ray inspection if the die is encased in a package. In some applications, identifying small features that are in close proximity may be difficult (e.g., multiple tabs associated with a single bond pad). Embodiments of the present invention are not limited to including multiple features on a single bond pad (e.g., as in FIG. 3), but can associate a single identifying feature with a single bond pad, and then use more bond pads to provide the desired code. Alternatively, embodiments of the present invention can provide identifying features of various shapes, and therefore convey more complex coding mechanisms.

Figure 5:
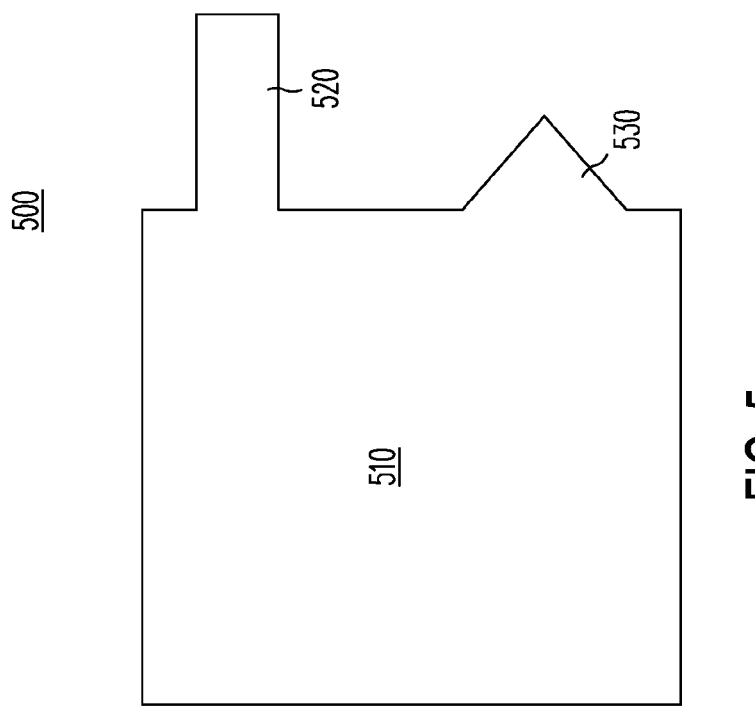
FIG. 5 is a simplified block diagram illustrating a bond pad having identification features of different shapes, in accord with embodiments of the present invention.

FIG. 5 is a simplified block diagram illustrating a bond pad having identification features of different shapes, in accord with embodiments of the present invention. Bond pad 500 has a main bond pad body 510 and a set of identification features 520 and 530. Identification feature 520 is in the form of a rectangle, while bond pad 530 is an alternative shape, here illustrated as a triangle. Through the use of different shapes, ternary coding systems and beyond can be used since each location along the edge of the bond pad can have shapes representative of a zero, one, two, and so forth. While a variety of shapes can be used, practical limitations related to optical or other detection means used for inspecting the identification features may limit usable shapes.

Figure 6:
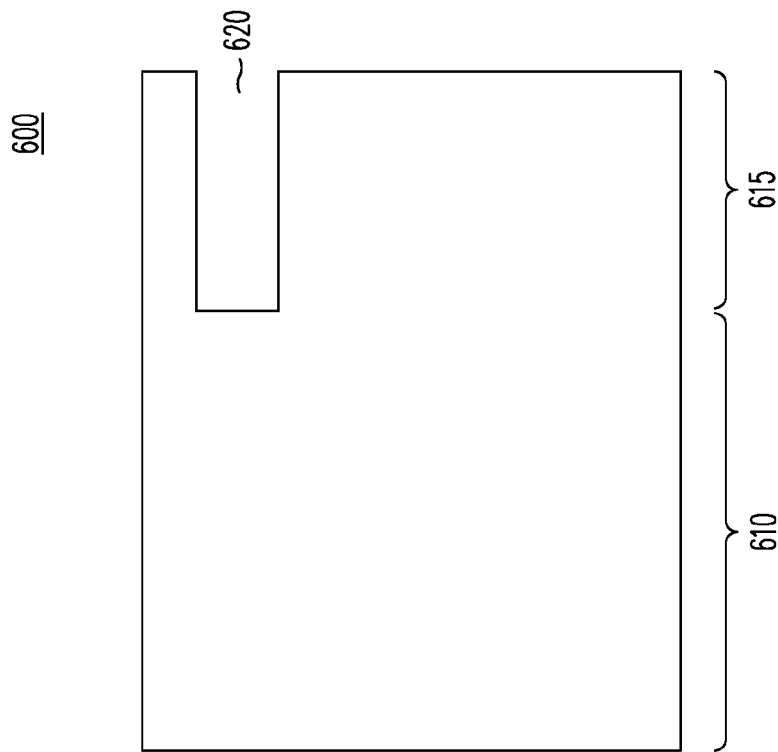
FIG. 6 is a simplified block diagram illustrating a bond pad having identification features provided by indentations in the bond pad, in accord with an alternative embodiment of the present invention.

FIG. 6 is a simplified block diagram illustrating a bond pad having identification features provided by indentations in the bond pad, in accord with an alternative embodiment of the present invention. Bond pad 600 has a main bond pad area 610 and an identification features area 615. As illustrated, an identification space 620 is formed in identification features area 615. As with the tabs of FIGS. 3-5, a number of identification spaces can be formed in the identification features areas of one or more bond pads to encode the desired information on the device die. In some optical identification applications, identification spaces may be more easily detected than tabs.

Embodiments of the present invention provide a mechanism by which identification information can be encoded on each device die of a semiconductor wafer. This information can be used, as discussed above, to uniquely identify each device die on the wafer by location or some other identification/mapping code. Since the identifying features are associated with bond pads formed on the device die, the identifying features can be provided with smaller minimum sizes than standalone features. Further, since the identifying features are associated with metalized features in a region of the die chosen to reduce RF interference and other interaction with the circuitry of the device die, such interactions will be minimized due to the identifying features themselves.

By now it should be appreciated that there has been provided a method for providing identifying marks to a semiconductor device die on a wafer. In one embodiment, the method includes forming a bond pad region of the semiconductor device die, forming a first bond pad in the bond pad region, and forming one or more bond pad features coupled to the first bond pad. An aspect of the one or more bond pad features provides information associated with the semiconductor device die.

One aspect of the above embodiment further includes forming one or more bond pads in the bond pad region, selecting one or more of the one or more bond pads to comprise one or more of the bond pad features, and selecting the aspects of the one or more bond pad features associated with the one or more selected bond pads. Selecting the one or more selected bond pads is performed to provide the information associated with the semiconductor device die. Selecting the aspects of the one or more bond pad features is performed to provide the information associated with the semiconductor device die. Further to this aspect, the information associated with the semiconductor device die uniquely identifies the semiconductor device die on the wafer. Further to the above aspect, the information associated with the semiconductor device die unquiely identifies a location of the semiconductor device die on the wafer. Further to this aspect, the information associated with the semiconductor device die includes an X-coordinate associated with a grid square, corresponding to the semiconductor device die, on a wafer map associated with the wafer, and a Y-coordinate associated with the grid square. Further to this aspect, the method further includes encoding the X-coordinate using a binary system and encoding the Y-coordinate using the binary system. A first set of one or more bond pad features corresponds to each digit of the binary X-coordinate. A second set of one or more bond pad features corresponds to each digit of the binary Y-coordinate.

Another aspect of the above embodiment provides for forming the one or more bond pad features associated with each of the one or more selected bond pads concurrently with forming the one or more selected bond pads. Further to this aspect, forming the one or more bond pad features associated with each of the one or more selected bond pads concurrently with forming the one or more selected bond pads includes: forming a conductive layer on a major surface of the wafer, forming a photoresist layer over the conductive layer, exposing the photoresist layer using a single photolithographic plate for the entire wafer, and etching the conductive layer in response to the exposed photoresist layer. Each semiconductor device die region of the single photolithographic plate provides the selected aspects of the one or more bond pad features associated with each of the one or more selected bond pads for the corresponding semiconductor device die.

In another aspect of the above embodiment, the aspects of the one or more bond pad features include a number of the bond pad features associated with each of the one or more selected bond pads. In another aspect of the above embodiment, the aspects of the one or more bond pad features include a shape of each bond pad feature. In still another aspect of the above embodiment, the aspects of the one or more bond pad features include indentations formed in the one or more selected bond pads. Another aspect provides for forming the first bond pad and the one or more bond pad features using a metal comprising one of gold or aluminum.

Another embodiment provides for a die located on a semiconductor wafer having a first bond pad located in a bond pad region, and one or more bond pad features coupled to the first bond pad where an aspect of the one or more bond pad features provides information associated with the die. In one aspect of the above embodiment the die further includes a first set of one or more bond pads in the bond pad region. The first set of bond pads includes the first bond pad. The first set of bond pads is configured to provide the information associated with the die. One or more of the first set of bond pads each includes one or more bond pad features.

Further to the above aspect, the information associated with the die uniquely identifies the die on the semiconductor wafer. Further to the above aspect, the information associated with the die uniquely identifies a location of the die on the wafer. Further to this aspect, the information associated with the die includes an X-coordinate associated with a grid square, corresponding to the die, on a wafer map associated with the semiconductor wafer, and a Y-coordinate associated with the grid square. Further to this aspect the die further includes a first set of the one or more bond pad features corresponding to each digit of a binary representation of the X-coordinate and a second set of the one or more bond pad features corresponding to each digit of a binary representation of the Y-coordinate.

With regard to one of the above aspects, the aspect of the one or more bond pad features includes one or more of a number of the bond pad features associated with the first bond pad, a shape of each bond pad feature, and indentations formed in the first bond pad.

Another embodiment provides a semiconductor wafer including a plurality of integrated circuit dies formed on the semiconductor wafer. Each integrated circuit die includes one or more bond pads located on the integrated circuit die and a first set of the one or more bond pads configured to provide unique information associated with the integrated circuit die by virtue of comprising one or more bond pad features associated with one or more bond pads of the first set of bond pads.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, the shape, size, and number of identifying features per bond pad can be modified within the scope of the invention. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method of providing identifying marks to a semiconductor device die on a wafer, the method comprising:
    forming a bond pad region of the semiconductor device die;
    forming a first bond pad in the bond pad region;
    forming one or more bond pad features coupled to the first bond pad, wherein
        an aspect of the one or more bond pad features provides information associated with the semiconductor device die;
    forming one or more bond pads in the bond pad region, wherein the one or more bond pads comprise the first bond pad;
    selecting one or more of the one or more bond pads to comprise one or more of the bond pad features, wherein said selecting the one or more selected bond pads is performed to provide the information associated with the semiconductor device die; and
    selecting the aspects of the one or more bond pad features associated with each of the one or more selected bond pads, wherein said selecting the aspects of the one or more bond pad features is performed to provide the information associated with the semiconductor device die.

2. The method of claim 1 wherein the information associated with the semiconductor device die uniquely identifies the semiconductor device die on the wafer.

3. The method of claim 1 wherein the information associated with the semiconductor device die uniquely identifies a location of the semiconductor device die on the wafer.

4. The method of claim 3 wherein the information associated with the semiconductor device die comprises:
    an X-coordinate associated with a grid square, corresponding to the semiconductor device die, on a wafer map associated with the wafer; and
    a Y-coordinate associated with the grid square.

5. The method of claim 4 further comprising:
    encoding the X-coordinate using a binary system, wherein
        a first set of the one or more bond pad features corresponds to each digit of the binary X-coordinate; and
    encoding the Y-coordinate using the binary system, wherein
        a second set of the one or more bond pad features corresponds to each digit of the binary Y-coordinate.

6. The method of claim 1 further comprising:
    forming the one or more bond pad features associated with each of the one or more selected bond pads concurrently with forming the one or more selected bond pads.

7. The method of claim 6 wherein said forming the one or more bond pad features associated with each of the one or more selected bond pads concurrently with forming the one or more selected bond pads comprises:
    forming a conductive layer on a major surface of the wafer;
    forming a photoresist layer over the conductive layer;
    exposing the photoresist layer using a single photolithographic plate for the entire wafer, wherein
        each semiconductor device die region of the single photolithographic plate provides the selected aspects of the one or more bond pad features associated with each of the one or more selected bond pads for the corresponding semiconductor device die;
    etching the conductive layer in response to the exposed photoresist layer.

8. The method of claim 1 wherein the aspects of the one or more bond pad features comprises a number of the bond pad features associated with each of the one or more selected bond pads.

9. The method of claim 1 wherein the aspects of the one or more bond pad features comprises a shape of each bond pad feature.

10. The method of claim 1 wherein the aspects of the one or more bond pad features comprise indentations formed in the one or more selected bond pads.

11. The method of claim 1 further comprises:
    forming the first bond pad and the one or more bond pad features using a metal comprising one of gold or aluminum.

* * * * *